(12) United States Patent
Lee et al.

(10) Patent No.: US 11,869,896 B2
(45) Date of Patent: Jan. 9, 2024

(54) DISPLAY DEVICE HAVING A SEMICONDUCTOR LAYER WITH A MESH STRUCTURE

(71) Applicant: Samsung Display Co., Ltd., Yongin-Si (KR)

(72) Inventors: Woo Bin Lee, Hwaseong-si (KR); Seok Hwan Bang, Yongin-si (KR); Seung Sok Son, Goyang-si (KR); Woo Geun Lee, Suwon-si (KR); Soo Jung Chae, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 261 days.

(21) Appl. No.: 17/368,200

(22) Filed: Jul. 6, 2021

(65) Prior Publication Data
US 2022/0139965 A1 May 5, 2022

(30) Foreign Application Priority Data
Oct. 30, 2020 (KR) .................. 10-2020-0143366

(51) Int. Cl.
*H01L 27/12* (2006.01)
*H10K 59/121* (2023.01)
*H10K 77/10* (2023.01)
*H10K 102/00* (2023.01)

(52) U.S. Cl.
CPC ...... *H01L 27/1222* (2013.01); *H01L 27/1218* (2013.01); *H01L 27/1225* (2013.01); *H10K 59/1213* (2023.02); *H10K 77/111* (2023.02); *H10K 2102/311* (2023.02)

(58) Field of Classification Search
None
See application file for complete search history.

(56) References Cited

U.S. PATENT DOCUMENTS

2013/0032802 A1* 2/2013 Kim ............... H10K 59/121
438/34
2021/0327922 A1* 10/2021 Huang ............ H01L 27/1244
2022/0066521 A1* 3/2022 Jia ................. H01B 7/04

FOREIGN PATENT DOCUMENTS

| KR | 10-0298488 B1 | 11/2001 |
| KR | 10-2005-0030571 A | 3/2005 |
| KR | 10-2008-0090304 A | 10/2008 |
| KR | 10-2012-0128304 A | 11/2012 |
| KR | 10-2016-0082799 A | 7/2016 |
| KR | 10-2020-0078933 A | 7/2020 |

* cited by examiner

Primary Examiner — J. E. Schoenholtz
(74) Attorney, Agent, or Firm — Innovation Counsel LLP

(57) ABSTRACT

A display device includes a substrate and a transistor disposed on the substrate and including a semiconductor layer, wherein the semiconductor layer includes a mesh structure, and wherein a plurality of openings are formed in the semiconductor layer.

19 Claims, 14 Drawing Sheets

DISPLAY DEVICE HAVING A SEMICONDUCTOR LAYER WITH A MESH STRUCTURE

CROSS-REFERENCE TO RELATED APPLICATION

This application claims priority to and benefits of Korean Patent Application No. 10-2020-0143366, filed in the Korean Intellectual Property Office on Oct. 30, 2020, the entire contents of which are incorporated herein by reference.

BACKGROUND

(a) Technical Field

The present disclosure relates to a display device. More particularly, the present disclosure relates to a display device capable of securing mechanical reliability even when the display device is deformed.

(b) Description of the Related Art

Electronic devices such as mobile phones, tablets, multimedia players, and televisions include display devices for displaying images. Each of the display devices includes a display panel that implements a screen displaying an image. A flexible display device capable of deformation such as bending, folding, rolling, and stretching by using a flexible substrate as a substrate for a display panel has been developed.

The above information disclosed in this Background section is only for enhancement of understanding of the background, and therefore, it may contain information that does not form the prior art that is already known in this country to a person of ordinary skill in the art.

SUMMARY

A display panel may include pixels that display an image. The pixels may include a light emitting element such as a light emitting diode and a pixel circuit for driving the light emitting element, and the pixel circuit may include transistors. A semiconductor layer (also referred to as an active layer) constituting a transistor may be damaged when the display device is deformed due to a high modulus of elasticity. Embodiments have been made in an effort to provide a display device capable of securing mechanical reliability even when the display device is deformed.

A display device according to an embodiment includes: a substrate; and a transistor disposed on the substrate and including a semiconductor layer, wherein the semiconductor layer includes a mesh structure, and wherein a plurality of openings are formed in the semiconductor layer.

The mesh structure may be a structure in which polygonal unit structures are interchangeably connected and repeated.

The mesh structure may be a honeycomb structure.

The plurality of openings may penetrate the semiconductor layer in a thickness direction of the semiconductor layer.

The display device may further include: a buffer layer disposed between the substrate and the semiconductor layer; a gate insulating layer disposed on the semiconductor layer; and a gate electrode of the transistor disposed on the gate insulating layer. The gate insulating layer may be in direct contact with the buffer layer through at least one of the plurality of openings.

The display device may further include an interlayer insulating layer disposed on the gate electrode; and a first electrode and a second electrode of the transistor disposed on the interlayer insulating layer. The interlayer insulating layer may be in direct contact with the buffer layer through at least one of the plurality of openings.

The display device may further include: a planarization layer disposed on the interlayer insulating layer; and a light emitting diode disposed on the planarization layer and including at least one electrode which is electrically connected to the first electrode or the second electrode.

The substrate may include a bendable area, and the semiconductor layer may be disposed in the bendable area.

The substrate may further include a flat area, and a transistor disposed in the flat area may include a solid semiconductor layer.

A display device according to an embodiment includes: a buffer layer disposed on the substrate; a semiconductor layer of a transistor disposed on the buffer layer; a gate insulating layer disposed on the semiconductor layer; and a gate electrode of the transistor disposed on the gate insulating layer, wherein a plurality of openings are defined in the semiconductor layer.

The semiconductor layer may include a mesh structure.

The mesh structure may be a structure in which polygonal unit structures are interchangeably connected and repeated.

The mesh structure may be a honeycomb structure.

The plurality of openings may penetrate the semiconductor layer in a thickness direction of the semiconductor layer.

The gate insulating layer may be in direct contact with the buffer layer through at least one of the plurality of openings.

The display device may further include: an interlayer insulating layer disposed on the gate electrode; and a first electrode and a second electrode of the transistor disposed on the interlayer insulating layer. The interlayer insulating layer may be in direct contact with the buffer layer through at least one of the plurality of openings.

The display device may further include: a planarization layer disposed on the interlayer insulating layer; and a light emitting diode disposed on the planarization layer and including an electrode that is electrically connected to the first electrode or the second electrode.

The substrate may include a bendable area, and the semiconductor layer may be disposed in the bendable area.

The substrate may further include a flat area, and the transistor disposed in the flat area may include a solid semiconductor layer.

According to the embodiments, it is possible to provide a display device capable of securing mechanical reliability even when the display device is deformed. In addition, according to the embodiments, there are other advantageous effects that can be recognized throughout the specification.

DETAILED DESCRIPTION OF THE EMBODIMENTS

Figure 1:
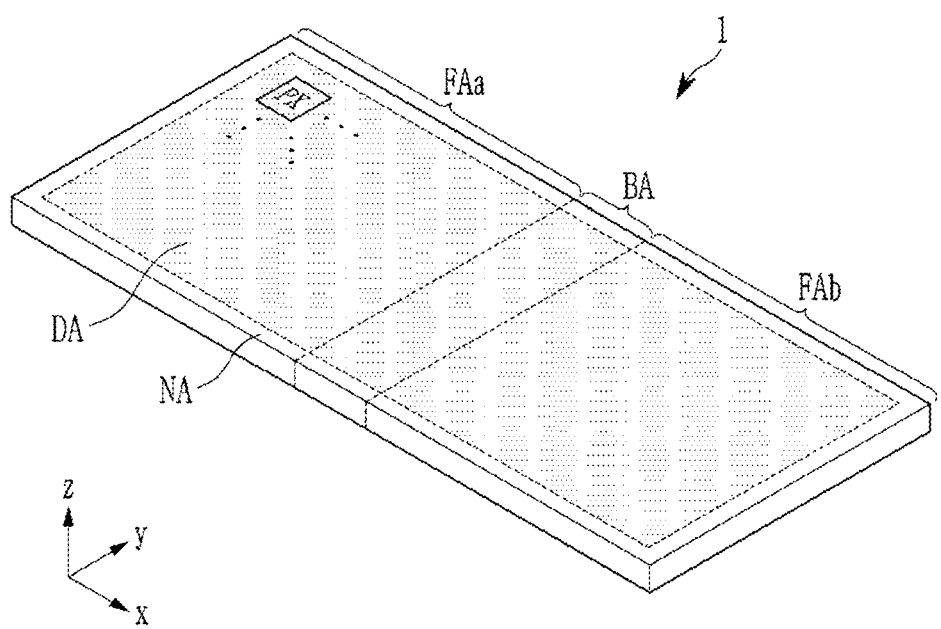
FIG. 1 illustrates a schematic perspective view of an unfolded state of a flexible display device according to an embodiment.

The present disclosure will be described more fully hereinafter with reference to the accompanying drawings, in which embodiments are shown.

Further, sizes and thicknesses of constituent elements shown in the accompanying drawings are arbitrarily given for better understanding and ease of description.

It will be understood that when an element such as a layer, film, area, or substrate is referred to as being "on" another element, it can be directly on the other element or intervening elements may also be present. In contrast, when an element is referred to as being "directly on" another element, there are no intervening elements present.

In addition, unless explicitly described to the contrary, the word "comprise" and variations such as "comprises" or "comprising" will be understood to imply the inclusion of stated elements but not the exclusion of any other elements.

In addition, in the specification, "connected" means that two or more components are not only directly connected, but two or more components may be connected indirectly through other components, physically connected as well as being electrically connected, or it may be referred to by different names depending on the location or function, but may include connecting each of parts that are substantially integral to each other.

In addition, in the specification, when a part "includes" a certain component, this means that other components may be further included unless specifically stated to the contrary.

In the drawings, signs "x", "y", and "z" are used to indicate directions, wherein x is used for indicating a first direction, y is used for indicating a second direction that is perpendicular to the first direction, and z is used for indicating a third direction that is perpendicular to the first direction and the second direction. The first direction x, the second direction y, and the third direction z may correspond to a horizontal direction, a vertical direction, and a thickness direction of the display device, respectively.

Figure 2:
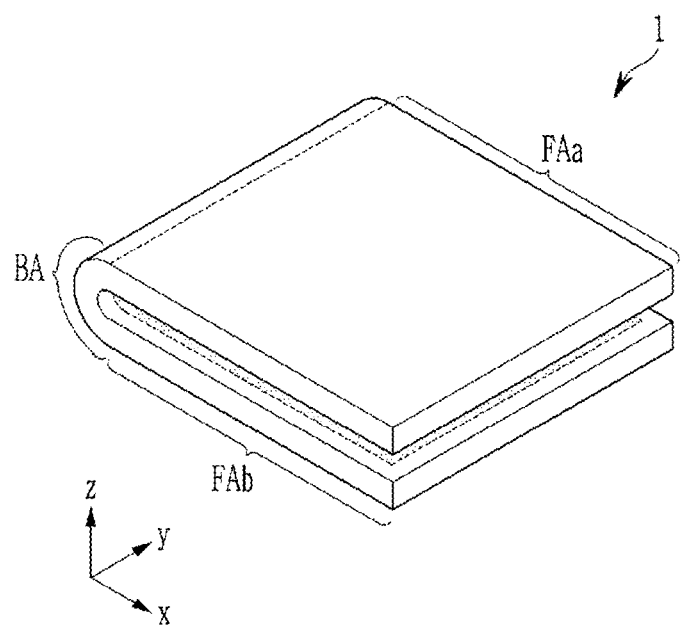
FIG. 2 illustrates a schematic perspective view of a first folded state of the flexible display device.
Figure 3:
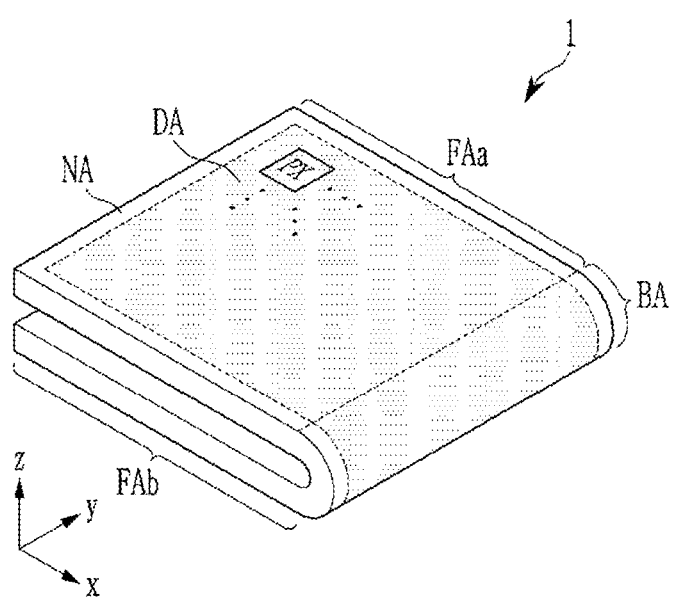
FIG. 3 illustrates a schematic perspective view of a second folded state of the flexible display device.

FIG. 1 illustrates a schematic perspective view of an unfolded state of a flexible display device according to an embodiment, FIG. 2 illustrates a schematic perspective view of a first folded state of the flexible display device, and FIG. 3 illustrates a schematic perspective view of a second folded state of the flexible display device.

The display device 1 may be a foldable display device that may be generally flatly unfolded as illustrated in FIG. 1, and may be a foldable display device that can be folded as illustrated in FIG. 2 and/or FIG. 3. The display device 1 may include a bendable area BA, a first flat area FAa, and a second flat area FAb. The bendable area BA is disposed between the first flat area FAa and the second flat area FAb. That is, the first area FAa is attached to one end of the bendable area BA, and the second area FAb is attached to another end of the bendable area BA. The bendable area BA is a portion that is bent when the display device 1 is folded, and the first flat area FAa and the second flat area FAb are not bent. The bendable region BA may be bent around a bending axis that is parallel to the second direction y.

Although one bendable area BA is illustrated, the display device 1 may include a plurality of bendable areas BA that are spaced apart from each other, can be bent with different radii of curvature, or may be bent around different bending axes such as the first, second, and third directions. For example, the display device 1 may include two or more bendable areas and three or more flat areas. Although the bendable area BA is illustrated to be positioned approximately at a center of the display device 1, a position and width of the bendable area BA in an entire area of the display device 1 may be variously changed.

The display device 1 may include a display area DA for displaying an image and a non-display area NA which surrounds the display area DA. The display area DA may correspond to a screen on which pixels PX are arranged. The non-display area NA may correspond to a bezel. The bendable area BA may be positioned across the display area DA. The display device 1 may include a display panel that implements a screen, and may include a cover window that covers the display panel.

As illustrated in FIG. 2, the display device 1 may be folded along the bendable area BA such that at least some front portions of the first flat area FAa and at least some front portions of the second flat area FAb may face each other (hereinafter, referred to as in-folding). As illustrated in FIG. 3, the display device 1 may be out-folded along the bendable area BA such that the screen is exposed to the outside (hereinafter, referred to as out-folding). In an in-folding state, at least some screen portions of the bendable area BA may be covered. In the out-folding state, at least some portions of the bendable area BA may be exposed for a user to see. The display device 1 may be designed to enable only one of in-folding and out-folding, or both. When the display device 1 includes a plurality of bendable areas BA, one of them may be a bendable area capable of in-folding, and another may be a bendable area capable of out-folding.

The display device 1 may further include a housing, and various components constituting the display device 1, such as a display panel, a driving device, a printed circuit board, an application processor, a memory, a speaker, a camera, and various sensors, may be disposed in a space defined by the cover window and the housing.

Figure 4:
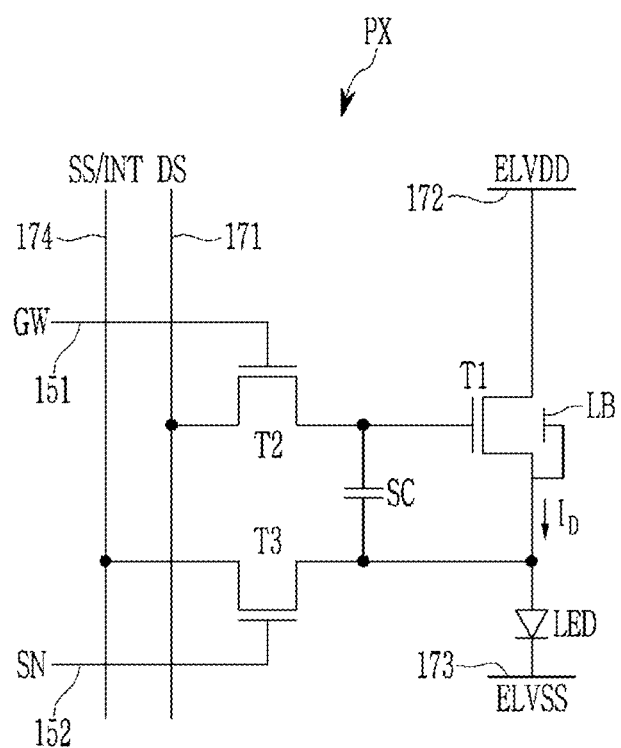
FIG. 4 illustrates an equivalent circuit diagram of one pixel in the flexible display device according to an embodiment.
Figure 5:
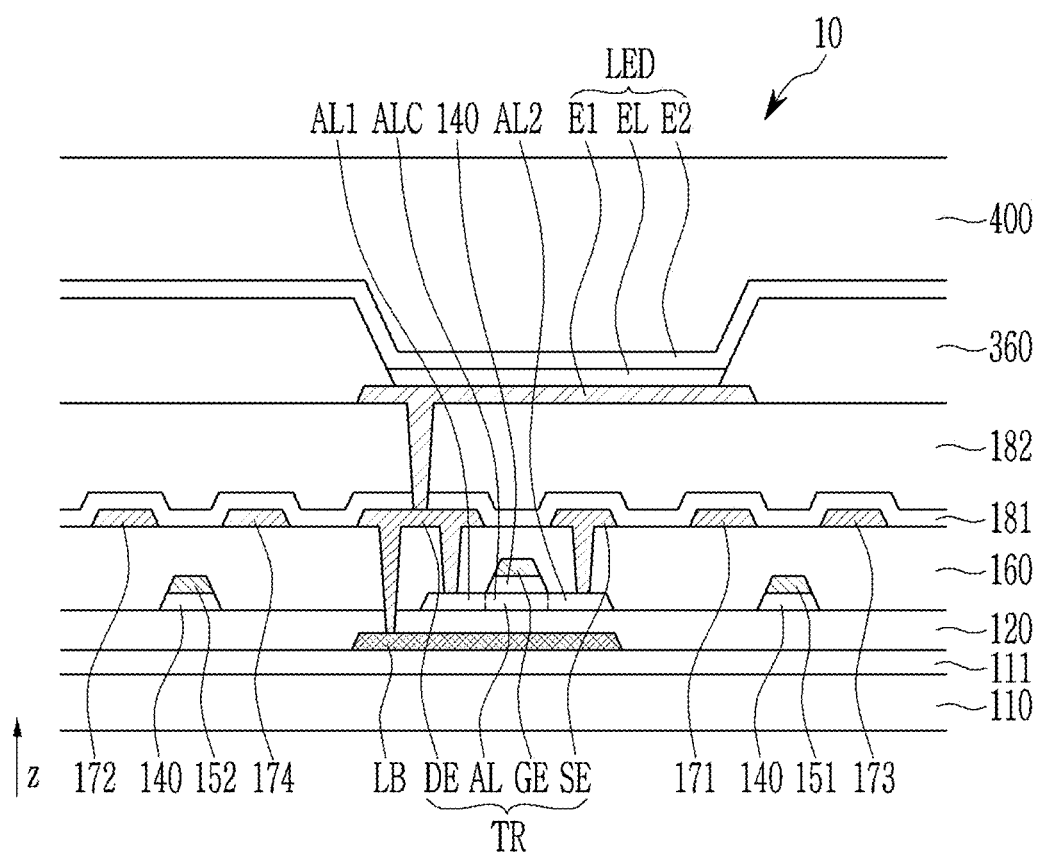
FIG. 5 illustrates a schematic cross-sectional view of one pixel in a flexible display panel according to an embodiment.

FIG. 4 illustrates an equivalent circuit diagram of one pixel in a display device according to an embodiment, and FIG. 5 illustrates a schematic cross-sectional view of one pixel in a flexible display panel according to an embodiment.

Referring to FIG. 4 and FIG. 5, the pixel PX may include a first transistor T1, a second transistor T2, a third transistor T3, a capacitor SC, and a light emitting diode LED. Signal lines such as a first scan line 151, a second scan line 152, a data line 171, a driving voltage line 172, a common voltage line 173, and an initialization voltage line 174 may be connected to the pixel PX. Although a structure in which the pixel PX includes three transistors and one capacitor is illustrated, a number of transistors and capacitors may be variously changed. Although a structure in which six signal lines are connected to the pixel PX is illustrated, a type and a number of signal lines may be variously modified.

The first transistor T1 may be a driving transistor, the second transistor T2 may be a switching transistor, and the third transistor T3 may be an initialization transistor or sensing transistor. The first transistor T1, the second transistor T2, and the third transistor T3 may be 3-terminal elements each of which includes a first electrode, a second electrode, and a gate electrode.

The first electrode of the first transistor T1 may be connected to the driving voltage line 172, and the second electrode of the first transistor T1 may be connected to the first electrode (hereinafter, also referred to as a pixel electrode) of the light emitting diode LED. The gate electrode of the first transistor T1 may be connected to the second electrode of the second transistor T2 and a first electrode of the capacitor SC. The first transistor T1 may output the driving current ID that varies depending on a magnitude of a data voltage DS applied to the gate electrode through the second transistor T2. The driving current ID may be supplied to the light emitting diode LED, and the light emitting diode LED may emit light with luminance that varies depending on a magnitude of the driving current ID.

The first transistor T1 may include a light blocking layer LB overlapping the semiconductor layer AL, and the light blocking layer LB may be connected to the second electrode of the first transistor T1, thereby improving characteristics of the first transistor T1 such as an output saturation characteristic.

The first electrode of the second transistor T2 may be connected to the data line 171, and the second electrode of the second transistor T2 may be connected to a gate electrode of the first transistor T1 and the first electrode of the capacitor SC. A gate electrode of the second transistor T2 may be connected to the first scan line 151. The second transistor T2 may be turned on depending on a scan signal GW received through the first scan line 151 to perform a switching operation of transferring the data voltage DS applied through the data line 171 to the gate electrode of the first transistor T1 and the first electrode of the capacitor SC.

The first electrode of the third transistor T3 may be connected to the initialization voltage line 174, and the second electrode of the third transistor T3 may be connected to the second electrode of the first transistor T1, the second electrode of the capacitor SC, and the first electrode of the light emitting diode LED. A gate electrode of the third transistor T3 may be connected to the second scan line 152. The third transistor T3 may initialize the second electrode of the first transistor T1, the second electrode of the capacitor SC, and the first electrode of the light emitting diode LED to an initialization voltage INT.

The third transistor T3 and the initialization voltage line 174 may be used to sense a characteristic such as a threshold voltage of the first transistor T1 that causes image quality deterioration. The third transistor T3 may be turned on depending on a sensing signal SN received through the second scan line 152 to electrically connect the first transistor T1 and the initialization voltage line 174, and a sensing unit connected to the initialization voltage line 174 may sense characteristic information of the first transistor T1 during a sensing period. Variations in characteristics (e.g., threshold voltage) of the first transistor T1, which may differ for each pixel PX, may be externally compensated by generating a compensated data voltage by reflecting characteristic information sensed through the third transistor T3 during the sensing period.

The first electrode of the capacitor SC may be connected to the gate electrode of the first transistor T1 and the second electrode of the second transistor T2, and the second electrode of the capacitor SC may be connected to the second electrode of the first transistor T1 and the first electrode of the light emitting diode LED. The capacitor SC may store the data voltage DS, and the stored data voltage DS may be applied to the first transistor T1 during an emission period. The second electrode (hereinafter, also referred to as a common electrode) of the light emitting diode LED may be connected to a common voltage line 173 transmitting a common voltage ELVSS.

Numbers of transistors TR and capacitors SC, connections, applied signals, and the like may be variously changed.

Referring to FIG. 5, the display device 1 includes a display panel 10 implementing a screen. The display panel 10 may basically include a substrate 110, a transistor TR positioned on the substrate 110, and a light emitting diode LED connected to the transistor TR. The light emitting diode LED may correspond to the pixel PX. The display panel 10 may be a light emitting display panel.

The substrate 110 may be a flexible substrate capable of being bent, folded, and rolled. The substrate 110 may include a polymer layer made of, e.g., a polyimide, a polyamide, and polyethylene terephthalate. The substrate 110 may include a barrier layer for preventing moisture, oxygen, etc. from penetrating. For example, the substrate 110 may include one or more polymer layers and one or more barrier layers, and the polymer layers and the barrier layers may be alternately stacked. The display panel 10 and the substrate 110 may include a first flat area, a second flat area, and a bendable area corresponding to the first flat area FAa, the second flat area FAb, and the bendable area BA of the display device 1, respectively.

A barrier layer 111 that prevents moisture and oxygen from penetrating the substrate 110 may be disposed. The buffer layer 111 may include an inorganic insulating material such as a silicon nitride ($SiN_x$), a silicon oxide ($SiO_x$), and a silicon oxynitride ($SiO_xN_y$), and may be a single layer or multiple layers.

A light blocking layer LB may be disposed on the barrier layer 111. The light blocking layer LB may prevent external light from reaching the semiconductor layer AL of the transistor TR, thereby preventing characteristic deterioration of the semiconductor layer AL. The light blocking layer LB may control a leakage current of the transistor TR, particularly the driving transistor in which a current characteristic is important in an emissive display device. The light blocking layer LB may include a material that does not transmit light in a wavelength band to be blocked, and may be a conductive layer including a metal such as molybdenum (Mo), titanium (Ti), copper (Cu), or aluminum (Al). Accordingly, the light blocking layer LB may function as an electrode to which a specific voltage is applied in the display panel. In this case, a current change rate in the saturation region of a voltage-current characteristic graph of the transistor TR may be lowered to improve characteristics as a driving transistor.

A buffer layer 120 may be disposed on the light blocking layer LB. The buffer layer 120 may improve the characteristics of the semiconductor layer by blocking impurities from the substrate 110 when the semiconductor layer AL is formed, and may flatten a surface of the substrate 110 to relieve a stress of the semiconductor layer. The buffer layer 120 may include an inorganic insulating material such as a silicon nitride, a silicon oxide, and a silicon oxynitride, and may be a single layer or multiple layers. The buffer layer 120 may include amorphous silicon (Si).

The semiconductor layer AL of a transistor TR may be disposed on the buffer layer 120. The semiconductor layer AL may include a first region AL1 and a second region AL2, and a channel region ALC therebetween. The semiconductor layer AL may be formed to relieve stress when the display panel 10 is deformed. The semiconductor layer AL may have a mesh structure. The mesh structure of the semiconductor layer AL and features related to stress relaxation will be described later.

The semiconductor layer AL may include any one of amorphous silicon, polysilicon, and an oxide semiconductor. For example, the semiconductor layer AL may include low temperature polysilicon (LTPS), and may include an oxide semiconductor material including at least one of zinc (Zn), indium (In), gallium (Ga), and tin (Sn). The semiconductor layer AL may include a composite oxide semiconductor such as an indium-gallium-zinc oxide (IGZO), an indium-tin-gallium oxide (ITGO), an indium oxide (InO), an indium-zinc oxide (IZO), an indium-tin-gallium-zinc oxide (ITGZO), an indium-zinc-tin oxide (IZTO), and a zinc-tin oxide (ZTO). In the semiconductor layer AL, a first region and a second region may be conductive. For example, hydrogen or the like may be injected into the first region and the second region.

A gate insulating layer 140 may be disposed on the semiconductor layer AL. The gate insulating layer 140 may include an inorganic insulating material such as a silicon nitride, a silicon oxide, and a silicon oxynitride, and may be a single layer or multiple layers.

A gate conductive layer that may include the gate electrode GE of the transistor TR, the first scan line 151, and the second scan line 152 may be disposed on the gate insulating layer 140. The gate conductive layer may include molybdenum (Mo), aluminum (Al), copper (Cu), titanium (Ti), and the like, and may be a single layer or multiple layers.

Meanwhile, in the illustrated embodiment, the gate electrode GE overlaps the gate insulating layer 140, the semiconductor layer AL, and the buffer layer 120.

An interlayer insulating layer 160 may be disposed on the gate conductive layer. The interlayer insulating layer 160 may include an inorganic insulating material such as a silicon nitride, a silicon oxide, and a silicon oxynitride, and may be a single layer or multiple layers.

A data conductive layer that may include a first electrode SE and a second electrode DE of the transistor TR, a data line 171, a driving voltage line 172, a common voltage line 173, and an initialization voltage line 174 may be disposed on the interlayer insulating layer 160. The first electrode SE and the second electrode DE may be connected to the first region AL1 and the second region AL2 of the semiconductor layer AL through different contact holes formed in the interlayer insulating layer 160 respectively. One of the first electrode SE and the second electrode DE may serve as a source electrode, and the other may serve as a drain electrode. One of the first electrode SE and the second electrode DE may be connected to the light blocking layer LB through a contact hole formed in the interlayer insulating layer 160 and the buffer layer 120. The data conductive layer may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), copper (Cu), and the like, and may be a single layer or multiple layers.

A passivation layer 181 may be disposed on the data conductive layer. The passivation layer 181 may include an inorganic insulating material such as a silicon nitride, a silicon oxide, and a silicon oxynitride, and may be a single layer or multiple layers.

A planarization layer 182 may be disposed on the passivation layer 181. The planarization layer 182 may be an organic insulating layer. For example, the planarization layer 182 may contain polymethylmethacrylate, a general purpose polymer such as polystyrene, a polymer derivative having a phenolic group, an acrylic polymer, an imide-based polymer (e.g., a polyimide), and an organic insulating material such as a siloxane-based polymer.

A first electrode E1 of the light emitting diode LED is disposed on the planarization layer 182. The first electrode E1 may be referred to as a pixel electrode. The first electrode E1 may be connected to the second electrode DE of the transistor TR through a contact hole formed in the planarization layer 182 and the passivation layer 181. The first electrode E1 may be electrically connected to the second electrode DE of the transistor TR through a conductor that may be positioned on the passivation layer 181 and the planarization layer 182. The transistor TR to which the first electrode E1 is connected may be a driving transistor or a transistor that is electrically connected to the driving transistor. The first electrode E1 may be formed of a reflective conductive material or a translucent conductive material, or may be formed of a transparent conductive material. The first electrode E1 may include a transparent conductive material such as an indium tin oxide (ITO) or an indium zinc oxide (IZO). The first electrode E1 may include a metal such as lithium (Li), calcium (Ca), aluminum (Al), silver (Ag), magnesium (Mg), or gold (Au), or a metal alloy.

A pixel definition layer 360 may be disposed on the planarization layer 182. The pixel definition layer 360 may be referred to as a partition wall, and may have an opening overlapping the first electrode E1. The pixel definition layer 360 may contain a general purpose polymer such as a polymer derivative having a phenolic group, an acrylic polymer, an imide-based polymer (e.g., a polyimide), and an organic insulating material such as a siloxane-based polymer.

The emission layer EL may be disposed on the first electrode E1 of the light emitting diode LED. In addition to the emission layer EL, at least one of a hole injection layer, a hole transport layer, an electron transport layer, and an electron injection layer may be disposed on the first electrode E1. The first electrode E1 overlaps the gate electrode GE, the first electrode SE, and the second electrode DE of the transistor TR.

A second electrode E2 of the light emitting diode LED is disposed on the emission layer EL. The second electrode E2 may be referred to as a common electrode. The second electrode E2 may be made of a low work function metal such as calcium (Ca), barium (Ba), magnesium (Mg), aluminum (Al), silver (Ag), or a metal alloy, as a thin layer to have light transmittance. The second electrode E2 may include a transparent conductive oxide such as an indium tin oxide (ITO) or an indium zinc oxide (IZO).

The first electrode E1, the emission layer EL, and the second electrode E2 may constitute a light emitting diode LED, such as an organic light emitting diode. The first electrode E1 may be an anode of a light emitting diode LED, and the second electrode E2 may be a cathode of a light emitting diode LED.

An encapsulation layer 400 may be disposed on the second electrode E2. The encapsulation layer 400 may encapsulate a light emitting diode LED to prevent moisture or oxygen from penetrating from the outside. The encapsulation layer may be a thin film encapsulation layer including one or more inorganic layers and one or more organic layers. A touch sensor layer (not illustrated) including touch electrodes for sensing a touch may be disposed on the encapsulation layer. An anti-reflection layer (not illustrated) for reducing external light reflection may be disposed on the touch sensor layer.

Figure 6:
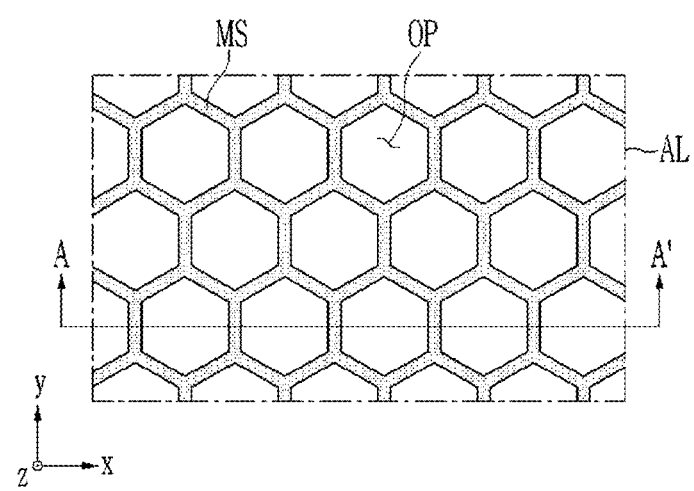
FIG. 6 illustrates a top plan view of a semiconductor layer according to an embodiment.
Figure 7:
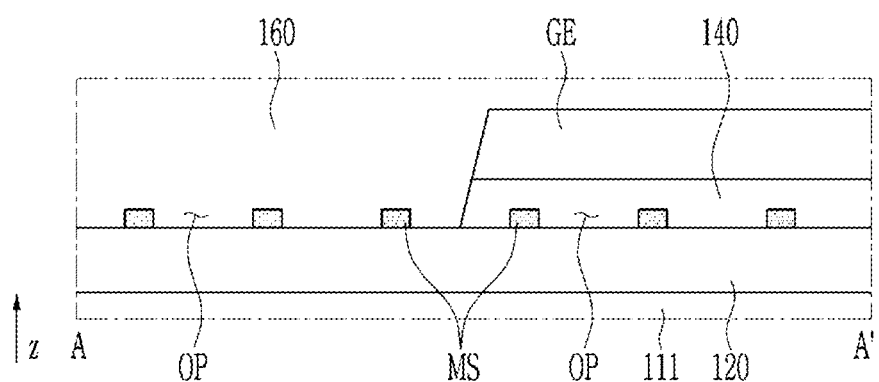
FIG. 7 illustrates a cross-sectional view taken along line A-A' of FIG. 6 according to an embodiment.
Figure 8:
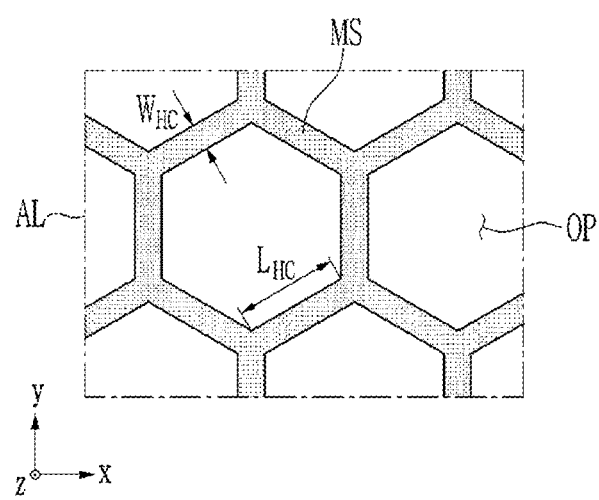
FIG. 8 illustrates a partially enlarged view of the semiconductor layer illustrated in FIG. 6.

FIG. 6 illustrates a top plan view of the semiconductor layer AL according to an embodiment, FIG. 7 illustrates a cross-sectional view taken along line A-A' of FIG. 6 according to an embodiment, and FIG. 8 illustrates a partially enlarged view of the semiconductor layer AL illustrated in FIG. 6. FIG. 7 illustrates layers positioned below and above the semiconductor layer AL among layers of the display panel 10 illustrated in FIG. 5.

FIG. 6, FIG. 7, and FIG. 8 specifically illustrate the semiconductor layer AL constituting the transistor TR described with reference to FIG. 5. The semiconductor layer AL may have a mesh shape in a plan view. That is, the semiconductor layer AL may have a mesh structure MS, and may have openings OP defined by the mesh structure MS. The openings OP may penetrate or extend through the semiconductor layer AL in a thickness direction (z-axis) of the semiconductor layer AL. The openings OP may be positioned across a channel region of the semiconductor layer AL and first and second regions at opposite sides thereof.

The mesh structure MS may be approximately a honeycomb structure. That is, the mesh structure MS may have a structure in which hexagonal unit structures are connected and repeated. The openings OP may be approximately hexagonal. Two of the hexagonal sides constituting the honeycomb structure may be positioned in parallel with the bending axis of the display device 1. All of the hexagonal sides constituting the honeycomb structure may be disposed not parallel to the bending axis of the display device 1. The openings OP may have a polygonal shape that different from a hexagonal shape, or may have various shapes such as a circle and an ellipse.

The gate insulating layer 140 may contact the buffer layer 120 through the openings OP of the semiconductor layer AL in the channel region of the semiconductor layer AL by the mesh structure of the semiconductor layer AL. The interlayer insulating layer 160 may contact the buffer layer 120 through openings OP of the semiconductor layer AL in the first region AL1 and second region AL2 of the semiconductor layer AL.

The mesh structure MS of the semiconductor layer AL may be formed by etching portions corresponding to the openings OP during patterning for forming the semiconductor layer AL. For example, the semiconductor layer AL may be formed by forming a semiconductor material layer by sputtering, chemical vapor deposition (CVD), atomic layer deposition (ALD), a solution process, etc., and then patterning it through a photolithography process. Typically, in the patterning, the solid semiconductor layer AL may be formed by etching a portion of a semiconductor material layer excluding an area where the semiconductor layer AL is formed by wet etching or dry etching, but the semiconductor layer AL having the mesh structure MS according to an embodiment may also be formed by etching portions corresponding to the openings OP in the area where the semiconductor layer AL is formed during patterning.

It is possible to reduce a stress applied to the semiconductor layer AL by forming the semiconductor layer AL in the mesh structure MS. In addition, when a crack occurs in the semiconductor layer AL, it is possible to prevent the crack from spreading. A degree of stress relaxation may be changed by adjusting a width $W_{HC}$ and length $L_{HC}$ of the honeycomb structure. For example, the stress may be further relieved by reducing the width $W_{HC}$ or increasing the length $L_{HC}$. However, in this case, since an electrical characteristic may be deteriorated, the width $W_{HC}$ and the length $L_{HC}$ may be adjusted in consideration of an allowable electrical characteristic and the like.

Since the semiconductor layer AL disposed in the first and second flat areas FAa and FAb of the display device 1 may not be deformed when the display device 1 is folded, the semiconductor layer AL disposed in the bendable area BA may have the mesh structure MS, and the semiconductor layer AL positioned in the first and second flat areas FAa and FAb may have a solid structure without openings. On the contrary, the semiconductor layer AL may have the mesh structure MS over an entire area of the display device 1 to prevent a characteristic deviation between the transistors TR disposed in the first and second flat areas FAa and FAb and the transistors TR disposed in the bendable area BA.

Although a description is made mainly in relation to the foldable display device, the semiconductor layer AL of the mesh structure MS may be applied to a flexible display device that may include a bendable area, such as a bendable display device, a rollable display device, and a stretchable display device.

Figure 9:
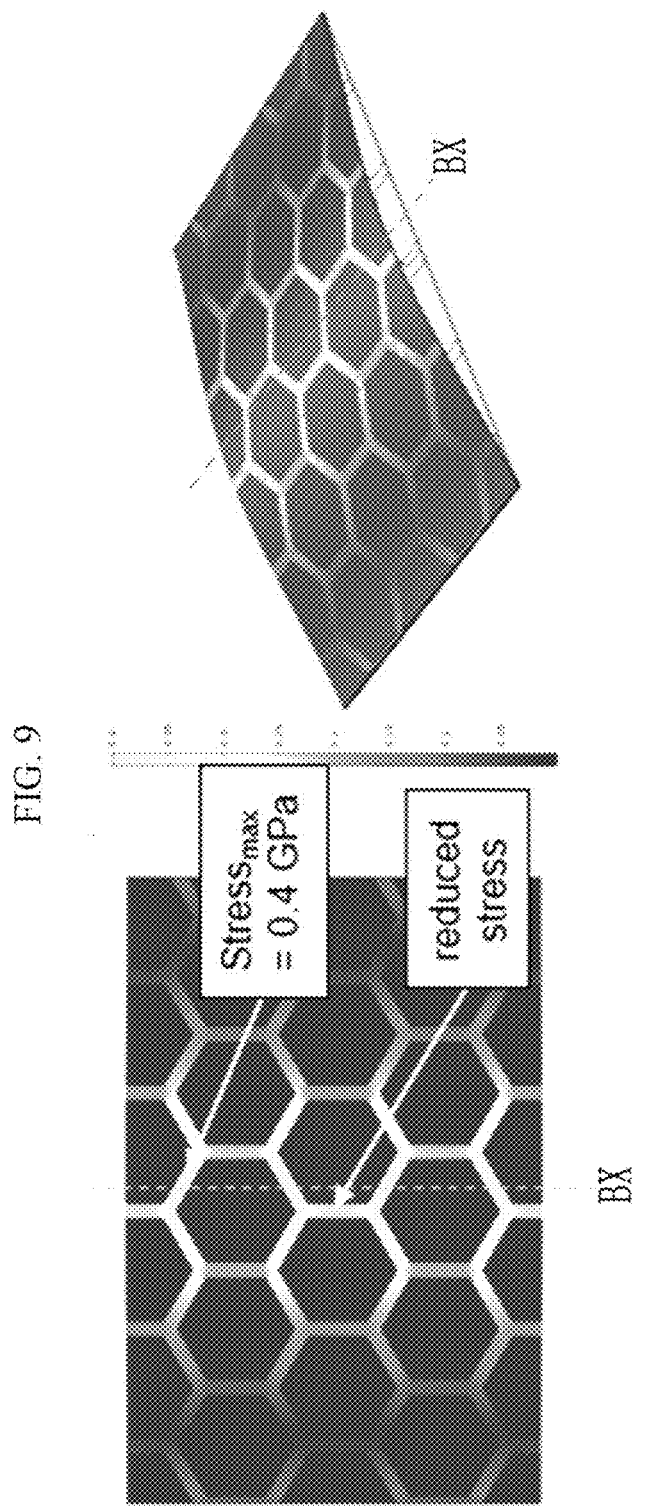
FIG. 9 illustrates a stress distribution during bending of the semiconductor layer according to an embodiment.
Figure 10:
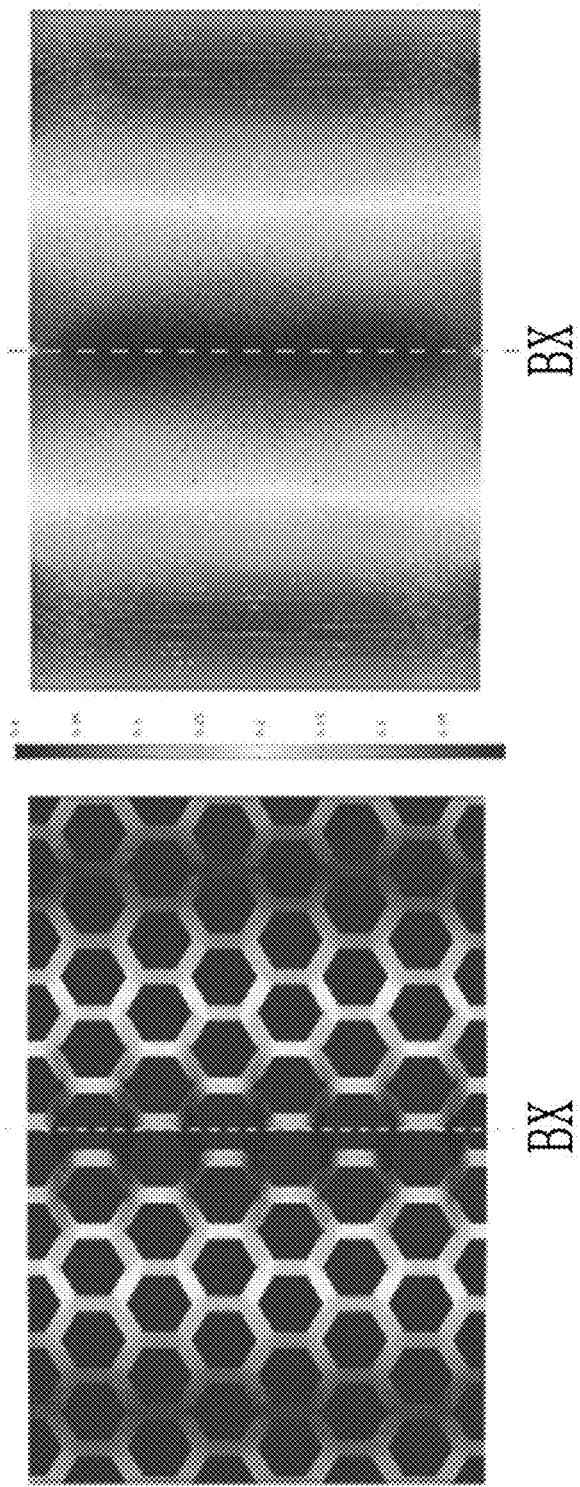
FIG. 10 illustrates stress distributions during bending of the semiconductor layer according to an example and the semiconductor layer according to a comparative example.

FIG. 9 illustrates a stress distribution during bending of the semiconductor layer according to an embodiment, and FIG. 10 illustrates stress distributions during bending of the semiconductor layer according to an example and the semiconductor layer according to a comparative example. Each drawing shows a simulation result of a stress change depending on a mechanical deformation of a semiconductor layer, and indicates that the stress increases as it turns red in the drawing.

Referring to FIG. 9 together with FIGS. 1, 2, 3, 4, 5, 6, 7, and 8, for example, when the bendable area BA of the display device 1 is bent around a bending axis BX, the semiconductor layer of a transistor disposed in the bendable area BA may also be bent around the bending axis BX. In this case, it can be seen that the stress is high (e.g., about 0.4 GPa at a maximum) at a portion that intersects the bending axis BX, but the stress decreases in a portion that is parallel to the bending axis BX in the mesh structure of the semiconductor layer.

Referring to FIG. 10, a left diagram shows a stress distribution of the semiconductor layer according to an example, and a right diagram shows a stress distribution of the semiconductor layer according to a comparative example. The semiconductor layer according to the comparative example has a conventional solid structure. In the semiconductor layer according to the comparative example, the stress is high not only in the portion that intersects the bending axis BX, but also in the portion parallel to the bending axis BX. On the other hand, as described above, in the semiconductor layer according to the example, the stress is low in the portion parallel to the bending axis BX. In addition, an area to which the stress is applied is reduced due to the openings in the semiconductor layer according to the example. Accordingly, when the display device is bent or folded, the stress applied to the semiconductor layer disposed in the bendable area BA is reduced, and thus occurrence of cracks in the semiconductor layer may be prevented or reduced, and mechanical reliability of the display device may be improved.

Figure 11:
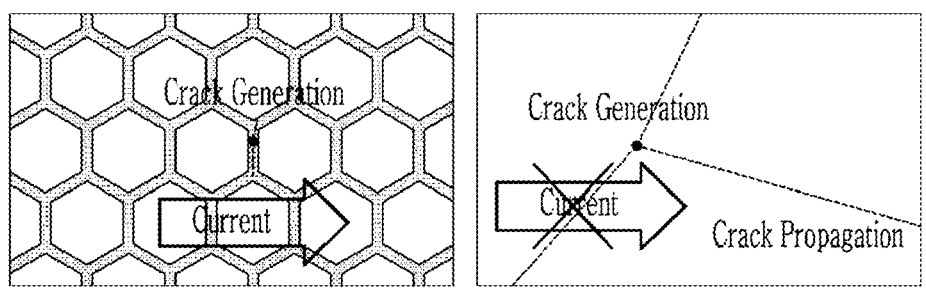
FIG. 11 illustrates propagation of cracks when the cracks occur in the semiconductor layer according to an example and the semiconductor layer according to a comparative example.

FIG. 11 illustrates propagation of cracks when the cracks occur in the semiconductor layer according to an example and the semiconductor layer according to a comparative example.

Referring to FIG. 11, a left diagram relates to the semiconductor layer according to an example, and a right diagram relates to the semiconductor layer according to a comparative example. When a crack occurs at a certain point in the semiconductor layer according to the comparative example, the crack may propagate in at least one direction. As a result, resistance of the semiconductor layer may increase, or a current may not flow through the semiconductor layer. In the semiconductor layer according to the example, even when a crack occurs, since an opening is formed in a region adjacent to a crack generation point, i.e., a region through which the crack may propagate, crack propagation may be suppressed. Even when a crack generation portion of the semiconductor layer is disconnected, other portions are connected by a mesh structure, and thus a current may flow through the semiconductor layer.

Figure 12:
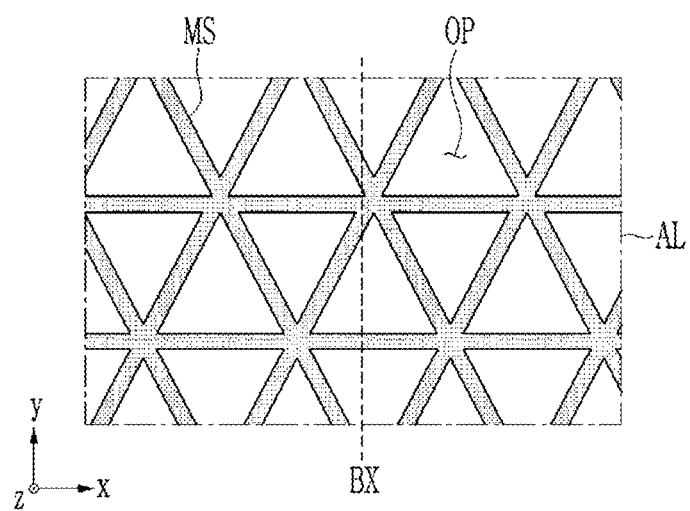
FIG. 12, FIG. 13, and FIG. 14 illustrate top plan views of a semiconductor layer according to an embodiment.
Figure 13:
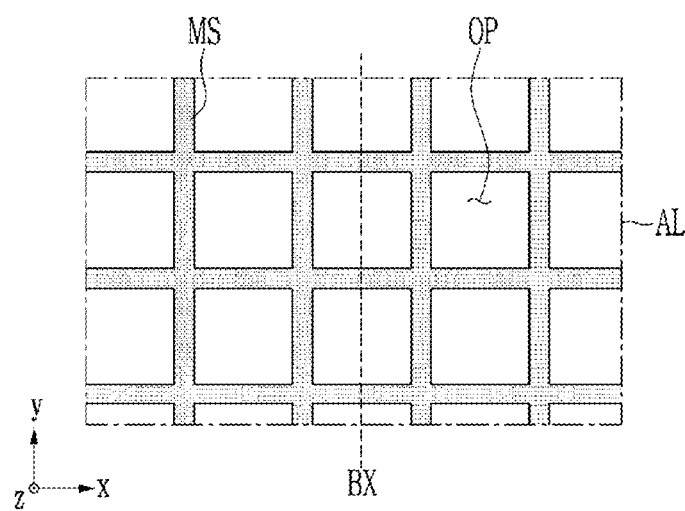
Figure 14:
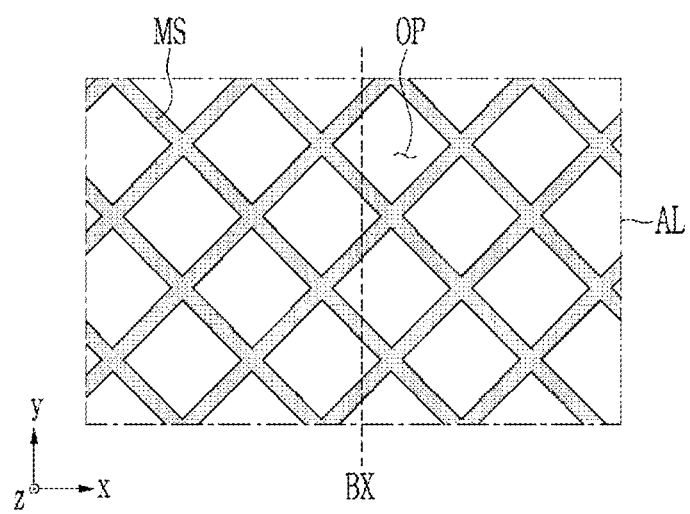

FIG. 12, FIG. 13, and FIG. 14 illustrate top plan views of the semiconductor layer according to an embodiment.

The mesh structure MS of the semiconductor layer AL of the transistor TR may have various shapes in addition to the honeycomb shape described above. For example, the mesh structure MS may be a structure in which an approximately triangular unit structure is repeated as shown in FIG. 12 or a structure in which an approximately rectangular unit structure is repeated as illustrated in FIG. 13 and FIG. 14. In addition, the mesh structure MS may be a structure in which polygonal unit structures such as a pentagon, a hexagon (the honeycomb structure described above), a heptagon, and an octagon are repeated. A direction of sides of the polygonal unit structure constituting the mesh structure MS may be substantially parallel or perpendicular to the bending axis BX which is substantially equal to the y-axis, as shown in FIG. 13, and may be inclined with respect to the bending axis BX as illustrated in FIG. 12 and FIG. 14.

Even when the mesh structure MS of the semiconductor layer AL has any shape or the shape of the mesh structure MS is disposed in any direction with respect to the bending axis BX, deterioration or cracking of the semiconductor layer AL may be suppressed by reducing the stress applied to the semiconductor layer AL. In addition, even when a crack occurs in the semiconductor layer AL, propagation of the crack may be suppressed, and thus electrical characteristics of the transistor TR due to deformation such as bending and folding of the display device 1 may be prevented from deteriorating.

While the present disclosure has been described in connection with what is presently considered to be practical embodiments, it is to be understood that the present disclosure is not limited to the disclosed embodiments, but, on the contrary, is intended to cover various modifications and equivalent arrangements included within the spirit and scope of the appended claims.

What is claimed is:

1. A display device comprising:
a substrate; and
a transistor disposed on the substrate and including a semiconductor layer and a gate electrode,
wherein the semiconductor layer includes a mesh structure, and
wherein a plurality of openings are formed in the semiconductor layer, and at least some of the plurality of the openings overlap the gate electrode.

2. The display device of claim 1, wherein
the mesh structure is a structure in which polygonal unit structures are interchangeably connected and repeated.

3. The display device of claim 1, wherein
the mesh structure is a honeycomb structure.

4. The display device of claim 1, wherein
the plurality of openings penetrate the semiconductor layer in a thickness direction of the semiconductor layer.

5. The display device of claim 1, further comprising:
a buffer layer disposed between the substrate and the semiconductor layer; and
a gate insulating layer disposed on the semiconductor layer,
wherein the gate electrode of the transistor disposed on the gate insulating layer, and
wherein the gate insulating layer is in direct contact with the buffer layer through at least one of the plurality of openings.

6. The display device of claim 5, further comprising:
an interlayer insulating layer disposed on the gate electrode; and
a first electrode and a second electrode of the transistor disposed on the interlayer insulating layer,
wherein the interlayer insulating layer is in direct contact with the buffer layer through at least one of the plurality of openings.

7. The display device of claim 6, further comprising:
a planarization layer disposed on the interlayer insulating layer; and
a light emitting diode disposed on the planarization layer and including at least one electrode which is electrically connected to the first electrode or the second electrode.

8. The display device of claim 1, wherein
the substrate includes a bendable area, and
the semiconductor layer is disposed in the bendable area.

9. The display device of claim 8, wherein
the substrate further includes a flat area, and
a transistor disposed in the flat area includes a solid semiconductor layer.

10. A display device comprising:
a substrate;
a buffer layer disposed on the substrate;
a semiconductor layer of a transistor disposed on the buffer layer;
a gate insulating layer disposed on the semiconductor layer; and
a gate electrode of the transistor disposed on the gate insulating layer,
wherein a plurality of openings are defined in the semiconductor layer, and at least some of the plurality of the openings overlap the gate electrode.

11. The display device of claim 10, wherein
the semiconductor layer includes a mesh structure.

12. The display device of claim 11, wherein
the mesh structure is a structure in which polygonal unit structures are interchangeably connected and repeated.

13. The display device of claim 11, wherein
the mesh structure is a honeycomb structure.

14. The display device of claim 10, wherein
the plurality of openings penetrate the semiconductor layer in a thickness direction of the semiconductor layer.

15. The display device of claim 10, wherein
the gate insulating layer is in direct contact with the buffer layer through at least one of the plurality of openings.

16. The display device of claim 15, further comprising:
an interlayer insulating layer disposed on the gate electrode; and
a first electrode and a second electrode of the transistor disposed on the interlayer insulating layer,
wherein the interlayer insulating layer is in direct contact with the buffer layer through at least one of the plurality of openings.

17. The display device of claim 16, further comprising:
a planarization layer disposed on the interlayer insulating layer; and
a light emitting diode disposed on the planarization layer and including an electrode that is electrically connected to the first electrode or the second electrode.

18. The display device of claim 10, wherein
the substrate includes a bendable area, and
the semiconductor layer is disposed in the bendable area.

19. The display device of claim 18, wherein
the substrate further includes a flat area, and
the transistor disposed in the flat area includes a solid semiconductor layer.

\* \* \* \* \*